United States Patent
Gupta et al.

(10) Patent No.: US 12,137,530 B2
(45) Date of Patent: Nov. 5, 2024

(54) METHOD AND APPARATUS FOR MAINTAINING COOLING OF MODULAR ELECTRONIC SYSTEM DURING MODULE REMOVAL

(71) Applicant: Cisco Technology, Inc., San Jose, CA (US)

(72) Inventors: Rohit Dev Gupta, Bangalore (IN); Joel Richard Goergen, Soulsbyville, CA (US); Sarma V M K Vedhanabhatla, Bangalore (IN); Damaruganath Pinjala, Bangalore (IN); Jatin Kohli, Bangalore (IN); Robert Gregory Twiss, Chapel Hill, NC (US)

(73) Assignee: CISCO TECHNOLOGY, INC., San Jose, CA (US)

( * ) Notice: Subject to any disclaimer, the term of this patent is extended or adjusted under 35 U.S.C. 154(b) by 429 days.

(21) Appl. No.: 17/470,465

(22) Filed: Sep. 9, 2021

(65) Prior Publication Data
US 2021/0410312 A1    Dec. 30, 2021

Related U.S. Application Data

(62) Division of application No. 16/819,399, filed on Mar. 16, 2020, now Pat. No. 11,172,587, which is a division of application No. 15/639,968, filed on Jun. 30, 2017, now Pat. No. 10,631,424.

(51) Int. Cl.
| | |
|---|---|
| *H05K 7/14* | (2006.01) |
| *G06F 1/20* | (2006.01) |
| *H05K 7/02* | (2006.01) |
| *H05K 7/18* | (2006.01) |
| *H05K 7/20* | (2006.01) |

(52) U.S. Cl.
CPC .......... *H05K 7/1401* (2013.01); *H05K 7/023* (2013.01); *H05K 7/1489* (2013.01); *H05K 7/20727* (2013.01); *H05K 7/20836* (2013.01); *G06F 1/20* (2013.01); *H05K 7/186* (2013.01); *H05K 7/20209* (2013.01)

(58) Field of Classification Search
CPC ...... H05K 7/023; H05K 7/186; H05K 7/1401; H05K 7/1489; H05K 7/20727; H05K 7/20836
USPC ....................................................... 702/132
See application file for complete search history.

(56) References Cited

U.S. PATENT DOCUMENTS

| | | | |
|---|---|---|---|
| 4,642,044 A | 2/1987 | Ishikawa | |
| 5,722,981 A * | 3/1998 | Stevens | A61B 17/12009 606/222 |
| 5,773,755 A | 6/1998 | Iwatare | |

(Continued)

*Primary Examiner* — John H Le

(57) ABSTRACT

A method that includes receiving an indication at a modular electronic system of initiation of online removal for a module removably inserted into a slot of the modular electronic system, increasing a fan speed at the modular electronic system before the module is removed, monitoring an internal temperature at the modular electronic system, and providing an indication that the module is ready for removal upon reaching a specified cooling state at the modular electronic system based on the temperature monitoring. A panel on an adjacent module is opened and extends into the slot upon removal of the module to substantially block airflow bypass from the slot and maintain cooling within the modular electronic system. An apparatus and logic are also disclosed herein.

20 Claims, 13 Drawing Sheets

(56) References Cited

U.S. PATENT DOCUMENTS

| | | |
|---|---|---|
| 6,307,738 B1 | 10/2001 | Tran |
| 6,816,975 B1 | 11/2004 | Sasaki |
| 7,344,439 B2 | 3/2008 | Henry |
| 7,843,683 B2 | 11/2010 | Suffern |
| 8,678,524 B2 | 3/2014 | Green |
| 9,301,431 B2 | 3/2016 | Esmaily |
| 10,631,424 B2 | 4/2020 | Gupta et al. |
| 11,172,587 B2 * | 11/2021 | Gupta .................. H05K 7/1401 |
| 2001/0006453 A1 | 7/2001 | Glorioso |
| 2003/0033393 A1 | 2/2003 | Larson |
| 2006/0048001 A1 | 3/2006 | Honda |
| 2006/0101054 A1 | 5/2006 | Dempski |
| 2007/0132550 A1 | 6/2007 | Avraham |
| 2009/0056359 A1 | 3/2009 | Germagian |
| 2011/0273835 A1 | 11/2011 | Katakura |
| 2013/0083481 A1 | 4/2013 | Goto |
| 2013/0155612 A1 | 6/2013 | Korikawa |
| 2014/0244881 A1 | 8/2014 | Stewart |
| 2014/0360232 A1 | 12/2014 | Al-Kahwati |
| 2015/0098180 A1 | 4/2015 | Berghe |
| 2015/0300047 A1 | 10/2015 | Leong et al. |
| 2016/0205812 A1 | 7/2016 | Curtin |
| 2017/0076575 A1 | 3/2017 | Kunnathur Ragupathi et al. |
| 2017/0318707 A1 | 11/2017 | Shabbir |
| 2018/0046226 A1 | 2/2018 | Bowers et al. |
| 2018/0082343 A1 | 3/2018 | Gordon |
| 2018/0148173 A1 | 5/2018 | Schwartz et al. |
| 2018/0217644 A1 | 8/2018 | Dan |
| 2018/0223573 A1 | 8/2018 | Wolfe |
| 2018/0310437 A1 | 10/2018 | Anderl |

\* cited by examiner

METHOD AND APPARATUS FOR MAINTAINING COOLING OF MODULAR ELECTRONIC SYSTEM DURING MODULE REMOVAL

CROSS-REFERENCE TO RELATED APPLICATIONS

The present application is a divisional application of U.S. patent application Ser. No. 16/819,399, filed Mar. 16, 2020, titled "METHOD AND APPARATUS FOR MAINTAINING COOLING OF MODULAR ELECTRONIC SYSTEM DURING MODULE REMOVAL", which is a divisional application of U.S. patent application Ser. No. 15/639,968, filed Jun. 30, 2017, now U.S. Pat. No. 10,631,424, the contents of which are incorporated by reference herein in their entireties and for all purposes.

TECHNICAL FIELD

The present disclosure relates generally to modular electronic systems, and more particularly, maintaining cooling of modular electronic systems during module replacement.

BACKGROUND

Modular electronic systems are designed to provide flexibility to configure systems as per user needs. These systems typically have multiple slots to accommodate a variety of modules (e.g., line cards, service cards, fabric cards, and the like). Most of these modules can be replaced with the latest product upgrades without disturbing normal operation of the system (i.e., hot swappable). It is desirable to replace faulty modules without powering down the system or impacting the performance of other modules in the system, such as by disrupting system cooling.

BRIEF DESCRIPTION OF THE DRAWINGS

Corresponding reference characters indicate corresponding parts throughout the several views of the drawings.

DESCRIPTION OF EXAMPLE EMBODIMENTS

Overview

Figure 1A:
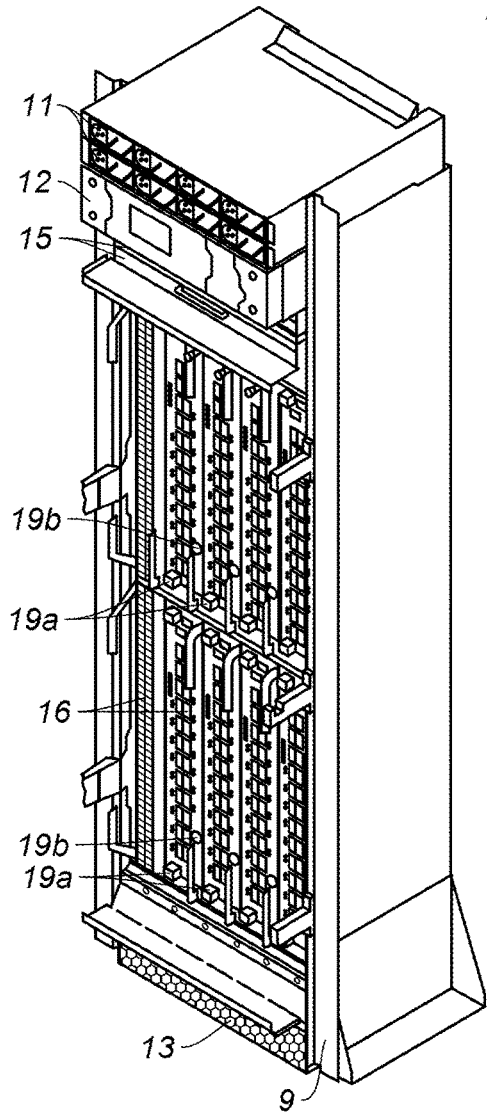
FIG. 1A is a perspective partial view of an example of a modular electronic system.

In one embodiment, a method generally comprises receiving an indication at a modular electronic system of initiation of online removal for a module removably inserted into a slot of the modular electronic system, increasing a fan speed at the modular electronic system before the module is removed, monitoring an internal temperature at the modular electronic system, and providing an indication that the module is ready for removal upon reaching a specified cooling state at the modular electronic system based on the temperature monitoring. A panel on an adjacent module is opened and extends into the slot upon removal of the module to substantially block airflow bypass from the slot and maintain cooling within the modular electronic system.

In another embodiment, an apparatus generally comprises a frame supporting a plurality of slidably removable modules, at least a portion of the modules each comprising a panel movable between a closed position and an open position in which the panel extends into an open slot from which a module is removed, a cooling fan for cooling said modules, a thermal sensor for sensing an internal temperature at the apparatus, and a processor configured to receive an indication of an online removal process for the module, increase a speed of the cooling fan, and provide an indication that the module is ready for removal upon identifying that the internal temperature has reached a cooling state. The panel on an adjacent module is configured to open and extend into the slot upon removal of the module to substantially block airflow bypass from the slot and maintain cooling within the modular electronic system.

In yet another embodiment, logic is encoded on one or more non-transitory computer readable media for execution and when executed by a processor operable to identify initiation of an online removal process for a module removably inserted into a slot of a modular electronic system, increase a fan speed at the modular electronic system before the module is removed, monitor an internal temperature at the modular electronic system, provide an indication that the module is ready for removal upon reaching a specified cooling state at the modular electronic system based on said monitored temperature, and unlock a panel on an adjacent module so that the panel is free to open and extend into the slot upon removal of the module to substantially block airflow bypass from the slot and maintain cooling within the modular electronic system.

Example Embodiments

The following description is presented to enable one of ordinary skill in the art to make and use the embodiments. Descriptions of specific embodiments and applications are provided only as examples, and various modifications will be readily apparent to those skilled in the art. The general principles described herein may be applied to other applications without departing from the scope of the embodiments. Thus, the embodiments are not to be limited to those shown, but are to be accorded the widest scope consistent with the principles and features described herein. For purpose of clarity, details relating to technical material that is known in the technical fields related to the embodiments have not been described in detail.

Network devices such as switches, routers, server racks, or other electronic devices may be configured as a modular electronic system with a plurality of removable modules (e.g., service cards, line cards, fabric cards, or other cards, components, or modules). In a modular configuration system, Online Insertion & Removal (OIR) refers to a process of replacing a module for repair or replacement (e.g., product upgrade, failed module replacement) without disrupting the performance of the modular system. During this process, the system continues to be functional and a faulty module is replaced with a new or repaired module.

In an air-cooled modular electronic system, cooling air is supplied to each of the modules to maintain a normal cool state of each module. When a module is removed from the system, a large amount of cooling air flows into a space (slot) from which the module has been removed and the cooling balance among the remaining modules is impacted. The open slot causes the system airflow to be unbalanced as the empty space provides a path of least resistance and airflow is allowed to bypass through this space resulting in other areas or components failing to receive sufficient airflow for cooling.

Depending on the complexity of the system design, the OIR process may take some time, during which the module slot would remain open to ambient air rushing in the now open slot. In a fan cooled system that is optimized for uniform flow through each of the slots, airflow would be negatively impacted as the slot opening would offer the least resistance airflow path and most of the air would start flowing through that open slot. This would reduce the airflow for other modules, thereby causing their component temperatures to rise, which often leads to overheating, and may potentially result in shorter life span or catastrophic failure of one or more of the operational modules remaining in the system.

In one example, it is desired to extend the OIR process to at least five minutes. This means that the open slot could be allowing air inrush for up to five minutes, starving air flow from the other cards, and possibly causing system failure. Meeting five minutes OIR times with hardware components operating above 80 Watts, for example, is increasingly difficult, if not impossible with conventional systems typically only allowing for replacement times of two minutes or less before overheating occurs.

The embodiments described herein provide for maintaining of cooling of modular electronic systems during module removal. As described in detail below, one or more embodiments provide cooling logic and an airflow panel to prevent the loss of cooling to modular components when modules are removed. In one or more embodiments, cooling fan logic may be used to increase cooling prior to removal of an OIR module to prevent the loss of cooling to the active modules during OIR. In one or more embodiments, in order to avoid airflow bypass from the open slot, a panel (airflow panel, flap, door) is provided, which is operational during OIR conditions and configured to prevent airflow bypass during module OIR. One or more embodiments may improve the OIR time limit for an extended period of time and possibly indefinitely, thereby providing high reliability and availability of modular electronic systems.

The embodiments described herein may operate in the context of a data communications network including multiple network devices. The network may include any number of network devices in communication via any number of nodes (e.g., routers, switches, gateways, controllers, edge devices, access devices, aggregation devices, core nodes, intermediate nodes, or other network devices), which facilitate passage of data within the network. One or more of the network devices may comprise a modular electronic system as described herein. The network devices may communicate over one or more networks (e.g., local area network (LAN), metropolitan area network (MAN), wide area network (WAN), virtual private network (VPN) (e.g., Ethernet virtual private network (EVPN), layer 2 virtual private network (L2VPN)), virtual local area network (VLAN), wireless network, enterprise network, corporate network, data center, Internet, intranet, radio access network, public switched network, or any other network).

Figure 1B:
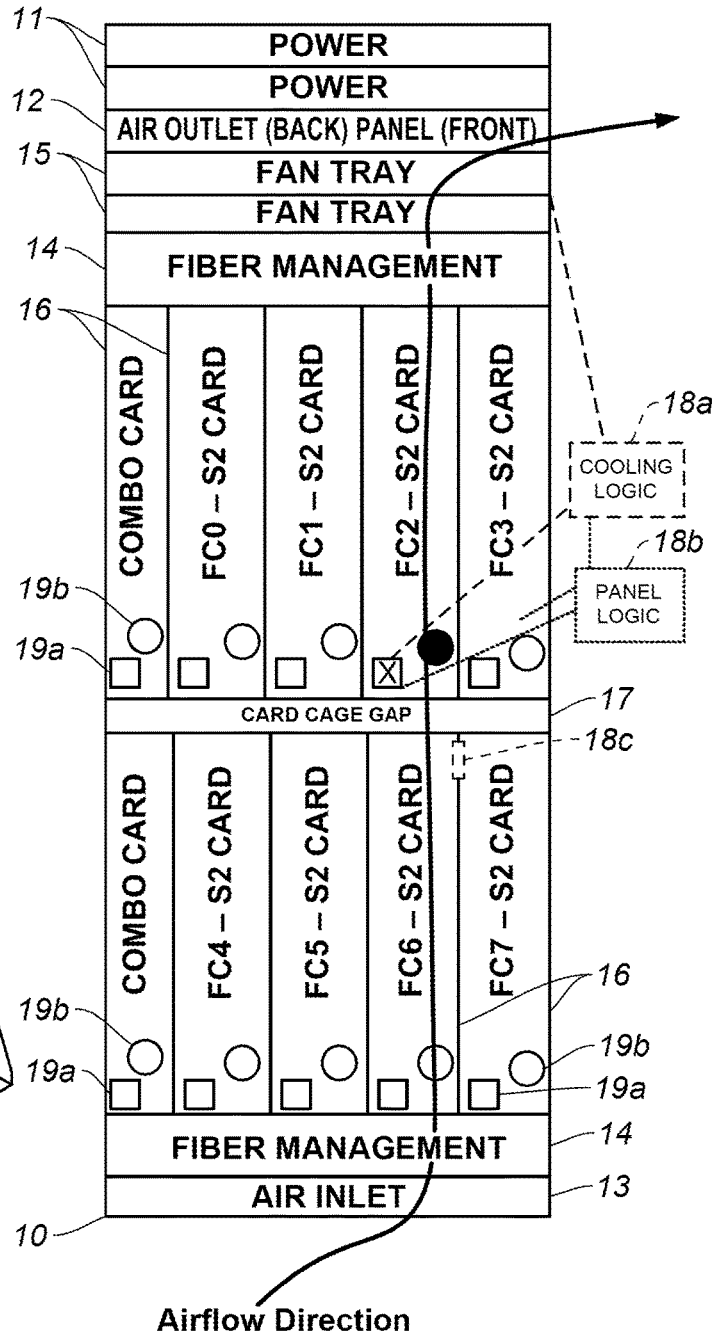
FIG. 1B is a front schematic view of the modular electronic system of FIG. 1A.

Referring now to the drawings, and first to FIGS. 1A and 1B, a perspective and front view, respectively, of one example of a modular electronic system 10 is shown. The modular electronic system 10 may operate, for example, as a switch, router, server, or any other network device comprising modules (components, cards, trays, elements) included in modular sections.

The modular electronic system 10 shown in FIGS. 1A and 1B comprises a plurality of components positioned horizontally or vertically in a system frame 9. The system 10 may include one or more frames or structures 9 configured to support the components and slidably receive any number of removable modules. Most or all of the components may comprise modules that are slidably removable from the frame. The example shown in FIGS. 1A and 1B includes power components 11, air outlet 12, air inlet 13, fan trays 15, fiber management 14, and a plurality of cards 16 (e.g., fabric cards, line cards, service cards, combo cards). A card cage gap 17 is interposed between the two rows of cards 16. It is to be understood that the type, number, and arrangement of components and modules shown in FIGS. 1A and 1B is only an example and the electronic modular system may include any number or type of modules arranged in any format.

One or more removable modules 16 comprise an OIR button 19a used in removal of the module 16. As described in detail below, the OIR buttons 19a may be in communication (e.g., mechanically, electronically, or both) with cooling logic 18a to initiate increased cooling of the modules 16 prior to removal of the OIR module, and with panel logic 18b to unlock an airflow panel on a module adjacent to the module to be removed to prevent airflow bypass once the module is removed.

The term OIR or online removal as used herein refers to removal of a module from the modular electronic system without removing power from the system (i.e., one or more remaining modules are operational). The module 16 removed from the system for replacement, repair, or upgrade is referred to herein as the "OIR module". The module 16 (or modules) that are thermally impacted due to airflow bypass from the open slot left by the OIR module is referred to herein as the "impacted module".

In one or more embodiments, an indication may be provided to notify a user when it is acceptable to remove the OIR module after initiation of the online removal process. For example, the modular electronic system may comprise a display or light on the chassis itself or each module. In the example shown in FIGS. 1A and 1B, the removable modules 16 comprise an OIR indicator 19*b*, which may comprise, for example, an LED (Light Emitting Diode) or other light or element operable to indicate the status of the OIR module. In one example, an LED may flash, light up, or change color to indicate that the module is ready to be removed. The OIR indicator 19*b* may, for example, be turned off under normal operating conditions and turned on to indicate the status of the OIR module prior to removal (e.g., after initiation of the OIR process by pressing OIR button 19*a*) and after replacement of the module until normal operating conditions are reached. For example, once the OIR button 19*a* on the OIR module is pressed, the LED 19*b* may turn amber, blinking blue, or any other color to indicate that the OIR module is not ready to be removed, and then turn green, solid blue, or any other color indicating that the OIR module can be safely removed once the system (e.g., one or more modules) has reached a specified cooling state (e.g., specified temperature or stabilized temperature). In one embodiment, a label may be provided on the module or system for use in interpreting the indicator 19*b*.

As described below, a fan speed may be increased once the OIR button 19*a* is pressed. One or more internal thermal sensors 18*c* in the modular electronic system 10 may be monitored to determine when the internal temperature has stabilized or reached a specified temperature, for example. When this cooling state is reached, the OIR indicator 19*b* may change color to indicate that the OIR module can be safely removed. Once the OIR module is removed, an airflow panel located on a module adjacent to the OIR module may be deployed to prevent airflow bypass through the open slot, as described below with respect to FIG. 2.

In the example shown in FIG. 1B, the FC2-S2 card (OIR module) is to be removed for replacement or upgrade. In this example, the FC6-S2 card may be referred to as the impacted module since it would be thermally impacted if airflow was allowed to bypass from the open slot once the OIR module is removed.

In order to start the OIR process, maintenance personnel may select the OIR button 19*a* (e.g., button mechanically depressed, tab pressed, lever moved or mechanically engaged, or other input at a selectable interface) on the module to be removed (FC2-S2 card in the example of FIG. 1B). This signals the cooling logic 18*a* to increase the fan speed to further cool the modules 16. As described in detail below, one or more thermal sensors 18*c* located on or near the modules 16 are monitored to determine when the temperature has stabilized to its lowest point. The OIR indicator 19*b* may signal that the OIR module is not ready for removal when the OIR button 19*a* is first pressed. Once the temperature has stabilized (as indicated by one or more thermal sensors 18*c*), the OIR indicator 19*b* changes state to indicate that the OIR module 16 is ready for removal.

In one or more embodiments, the modules 16 may be physically locked in placed (e.g., ejector locked) until the temperature has stabilized after the fan speed has increased. Once the modules are sufficiently cooled, the OIR module may be physically unlocked or released (e.g., ejector unlocked) at approximately the same time (or slightly before) the OIR indicator 19*b* changes state to indicate that the OIR module is ready for removal.

Figure 2:
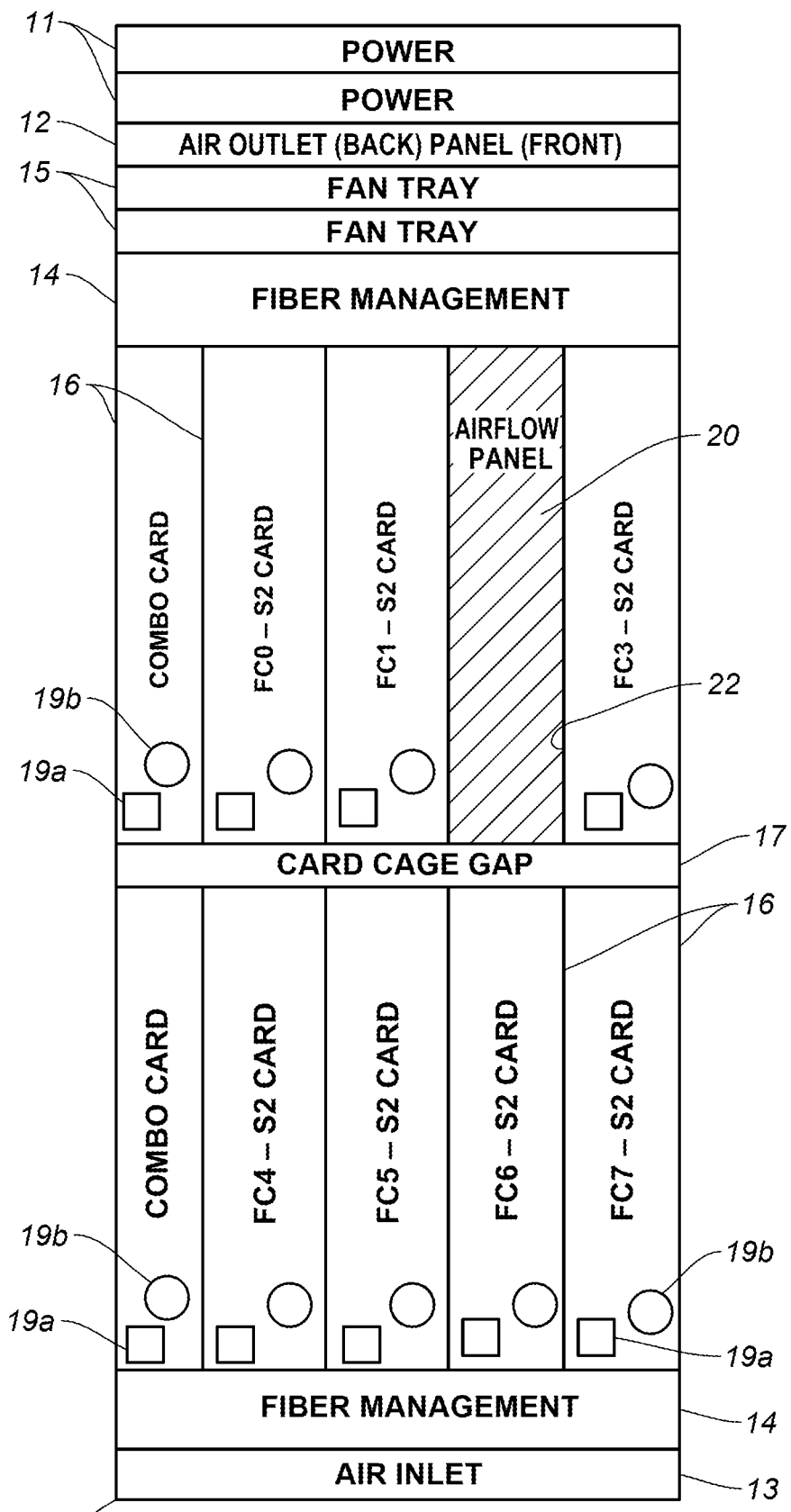
FIG. 2 is a front schematic view of the modular electronic system of FIG. 1B with a module removed.

FIG. 2 illustrates the modular electronic system shown in FIG. 1B with one of the modules (FC2-S2 card) removed. As shown in FIG. 2, an airflow panel 20 is deployed into opening 22 when the OIR module is removed to prevent airflow bypass through the open slot by limiting or restricting the flow of cooling air through the slot.

As described in detail below, after the OIR process is initiated, the airflow panel 20 may be unlocked by panel logic 18*b* so that it is ready to deploy into the open slot when the OIR module is removed (FIGS. 1B and 2). The panel logic 18 may initiate the unlocking or releasing of the airflow panel 20 on one of the adjacent modules (e.g., FC1-S2 card or FC3-S2 card) after initiation of the OIR process. The panel 20 may be unlocked as soon as the OIR button 19*a* is pressed or after the stabilized temperature is reached and the OIR module is ready to be removed.

It is to be understood that the modular electronic system 10, modules 16, OIR button 19*a*, and OIR indicator 19*b* shown in FIGS. 1A, 1B, and 2 and described above are only examples, and that a different number, type, or arrangement of modules, components, or OIR mechanisms may be used without departing from the scope of the embodiments.

Figure 3:
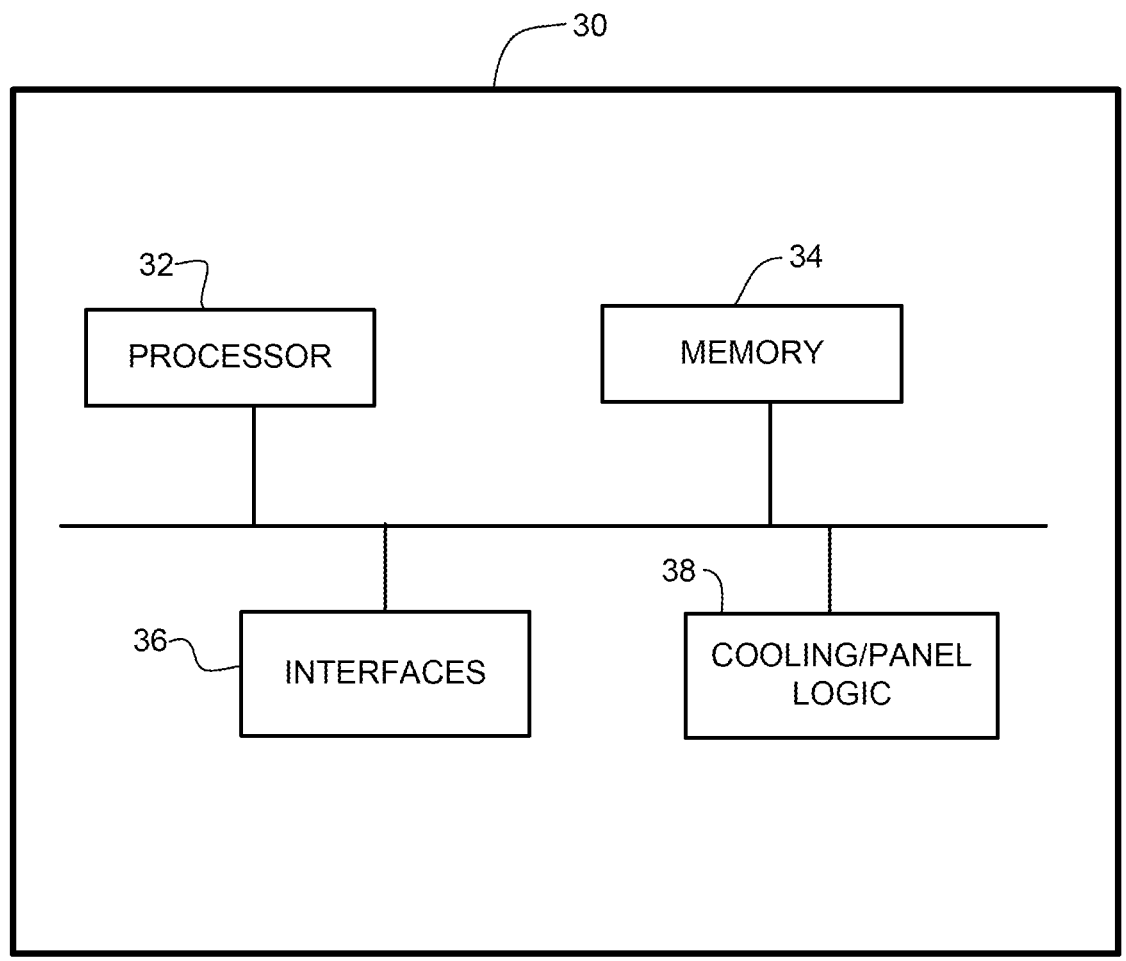
FIG. 3 is a block diagram depicting an example of a network device that may be used to implement the embodiments described herein.

FIG. 3 illustrates an example of a network device (modular electronic system) 30 that may be used to implement the embodiments described herein. In one embodiment, the network device 30 is a programmable machine that may be implemented in hardware, software, or any combination thereof. The network device 30 includes one or more processor 32, memory 34, network interfaces 36, and cooling/panel logic element 38.

Memory 34 may be a volatile memory or non-volatile storage, which stores various applications, operating systems, modules, and data for execution and use by the processor 32. For example, components of the cooling/panel element 38 (e.g., code, logic, software, firmware, etc.) may be stored in the memory 34. The network device 30 may include any number of memory components.

Logic may be encoded in one or more tangible media for execution by the processor 32. For example, the processor 32 may execute codes stored in a computer-readable medium such as memory 34. The computer-readable medium may be, for example, electronic (e.g., RAM (random access memory), ROM (read-only memory), EPROM (erasable programmable read-only memory)), magnetic, optical (e.g., CD, DVD), electromagnetic, semiconductor technology, or any other suitable medium. In one example, the computer-readable medium comprises a non-transitory computer-readable medium. The processor 32 may be operable to perform one or more steps shown in the flowcharts of FIG. 4 or 5, for example. The network device 30 may include any number of processors 32.

The cooling/panel logic 38 may comprise one or more components (software, code, logic) operable to monitor module presence, receive input from OIR button 19*a*, receive input from thermal sensors 18*c*, control fan speed based on ambient temperature sensor and thermal sensor of critical modules 16, activate unlocking of panel 20, and lock/unlock module ejectors (FIGS. 2 and 3).

The network interfaces 36 may comprise any number of interfaces (connectors, line cards, ports) for receiving data or transmitting data to other devices. The network interface 36 may include, for example, an Ethernet interface located on one of the modules 16 for connection to a computer or network.

It is to be understood that the network device 30 shown in FIG. 3 and described above is only an example and that different configurations of network devices may be used. For example, the network device 30 may further include any suitable combination of hardware, software, algorithms, processors, devices, components, or elements operable to facilitate the capabilities described herein.

Figure 4:
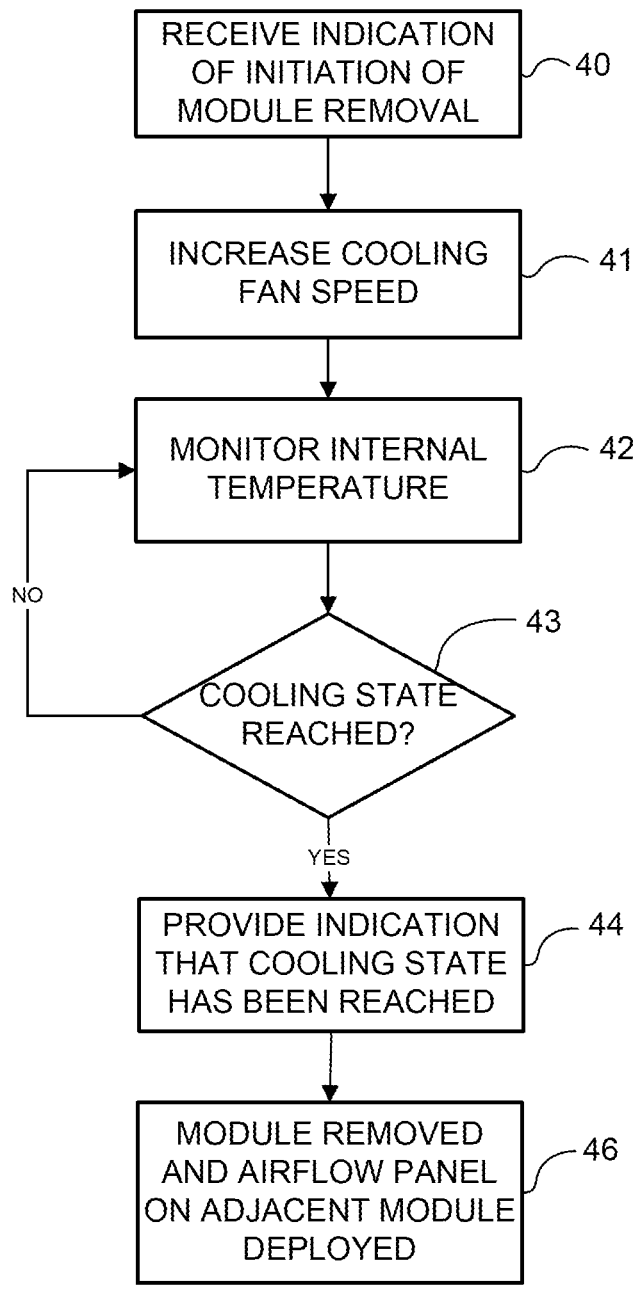
FIG. 4 is a flowchart illustrating an overview of a process for maintaining cooling of the modular electronic system during removal of a module, in accordance with one embodiment.

FIG. 4 is a flowchart illustrating an overview of a process for maintaining cooling in the modular electronic system 10 upon removal of one of the modules 16, in accordance with one embodiment. At step 40, the system receives an indication of initiation of an online removal process for a module 16 inserted into a slot 22 of the modular electronic system 10 (FIGS. 2 and 4). The indication may be based, for example, on maintenance personal pressing the OIR button 19a on the module 16 to be removed. This may initiate one or more actions, including, for example, increasing of the fan speed at one or more cooling fans (e.g., at fan tray 15) at the modular electronic system 10 to reduce the temperature of the modules 16 (step 41). This may also result in the locking of the OIR module 16 in place (if the module is not already locked) and signaling of an indication that the module is not ready for removal (e.g., LED turning on, changing color, blinking). One or more temperature sensors 18c internal to the modular electronic system 10 (e.g., one or more temperature sensors in slots 22, adjacent to the slots, or near or on the modules 16) may be monitored to determine when the temperature reaches a specified cooling state at the modular electronic system 10 (e.g., sensors stabilize to lowest temperature or reach a threshold temperature) (steps 42 and 43).

When the temperature has stabilized to the specified cooling state, the OIR module 16 is ready to be removed and an indication is provided (step 44). An indication that the modular electronic system (e.g., module, portion, or section of modular electronic system) has reached its cooling state may comprise, for example, a visible indication (e.g., a change in color of a light (e.g., LED turning off, changing color, or blinking light turning solid)), or unlocking of a physical lock (e.g., module ejector unlocked or released). A lock on the airflow panel 20 may also be released. The lock may be released at the same time that the LED 19b indicates the OIR module 16 is ready to be removed or may be released as soon as the OIR button 19a is pressed. Once the OIR module 16 is removed, the airflow panel on an adjacent module is free to be released from the adjacent module and deployed into the open slot 22 to prevent air bypass from the slot and maintain cooling within the modular electronic system (step 46).

Figure 5:
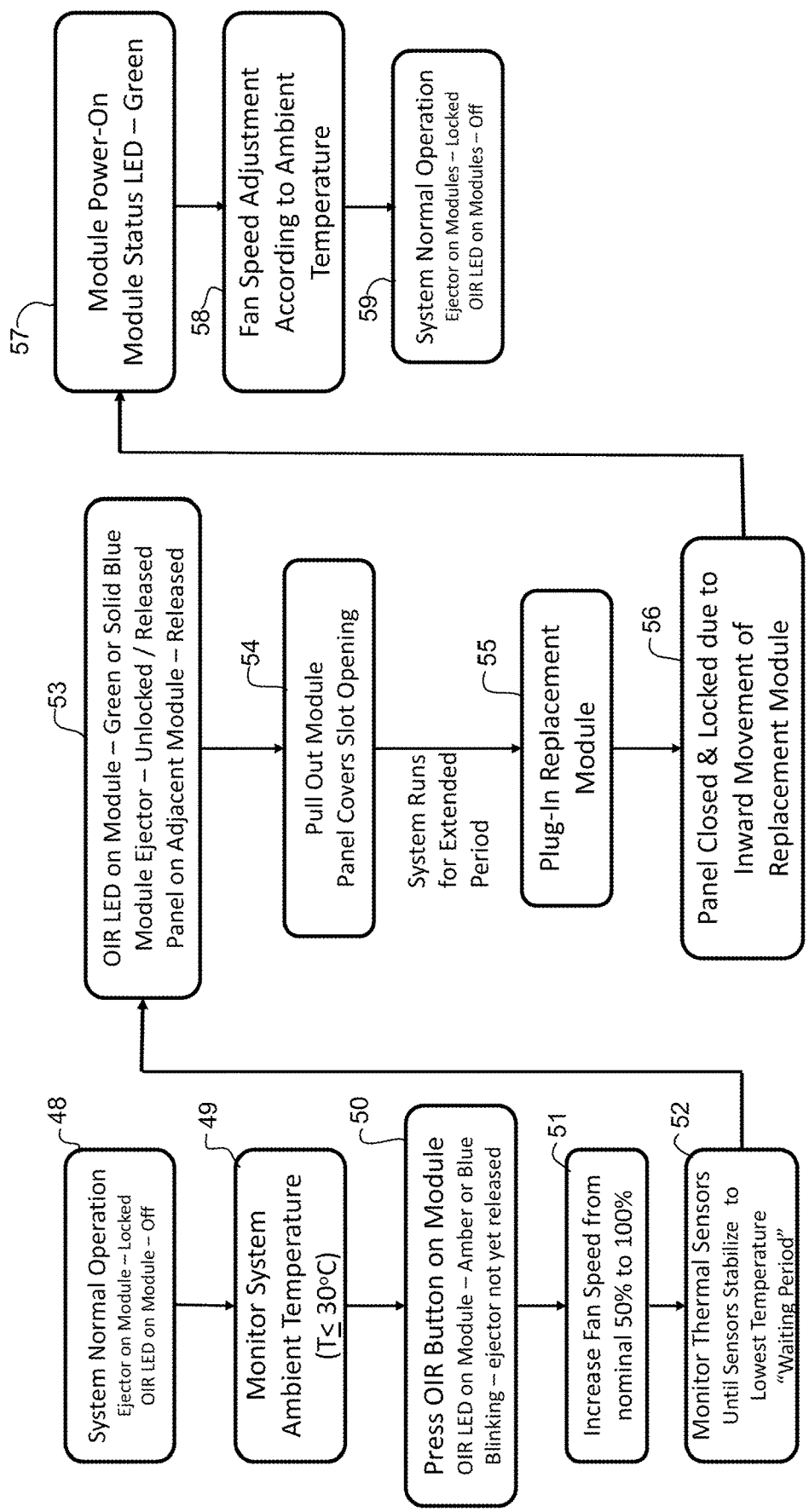
FIG. 5 is a flowchart illustrating details of the process of FIG. 4, in accordance with one embodiment.

FIG. 5 illustrates details of the process shown in FIG. 4 for maintaining cooling of a modular electronic system during module removal, in accordance with one embodiment. At step 48, the system is operating normally (i.e., the OIR process has not been initiated). The ejectors on the modules 16 are locked (no OIR buttons 19a have been pressed) and the OIR LEDs 19b on the modules are off (FIGS. 2 and 5). The system ambient temperature is monitored (step 49). In one example, an ambient temperature ≤30° C. is preferred. At step 50, the OIR button 19a on one of the modules 16 is pressed. The OIR LED 19b on the module turns on (e.g., turns amber or blinking blue). The ejector is not yet released. The fan speed is increased from nominal 50% to 100% (or any other increase) (step 51). The thermal sensors are monitored to determine when the sensors stabilize to a lowest temperature (step 52). This time period may be referred to as a "waiting period" or "cooling period".

At step 53, the temperature sensors have stabilized and the OIR LED 19b on the OIR module 16 changes (e.g., turns green or solid blue light) and the module ejector is unlocked or released. The lock on airflow panel 20 on an adjacent module is also released. The OIR module 16 may then be pulled out thereby releasing the panel on the adjacent module so that it covers the opening in the slot left behind by the removed OIR module (step 54). The system may then run for an extended period (or possibly indefinitely). At step 55, a replacement module 16 is inserted into the open slot 22. The panel 20 is closed and locked in place when the replacement module is inserted into the slot due to inward movement of replacement module (step 56). The module power is turned on and the module status LED turns green (step 57). The fan speed may be adjusted based on the ambient temperature (step 58). The system returns to normal operation, the ejector on the module is locked, and the OIR LED on the module is turned off (step 59).

It is to be understood that the processes shown in FIGS. 4 and 5, and described above are only examples and that steps may be added, combined, removed, or modified, without departing from the scope of the embodiments.

As previously described with respect to FIG. 2, a panel 20 attached to an adjacent module (e.g., FC3-S2 card) may be deployed into the cavity 22 from which the module (e.g., FC2-S2 card) is removed to cover the open slot left by removal of the module during OIR. In one embodiment, the panel 20 is an integral part of the module 16 and remains within a footprint of current module boundaries. In one or more embodiments, the panel 20 is controlled between an open position in which the panel is deployed into the adjacent open slot 22 and a closed (locked) position in which the panel is generally longitudinally parallel to the module and the adjacent module is inserted into the slot. The panel 20 is preferably designed to prevent obstruction of electronic components and interference with removal and insertion of adjacent modules 16. As described below, the panel 20 may be provisioned on one or both sides of the module 16 to cover one or both adjacent slots, with each panel operating independently from one another.

Figure 6:
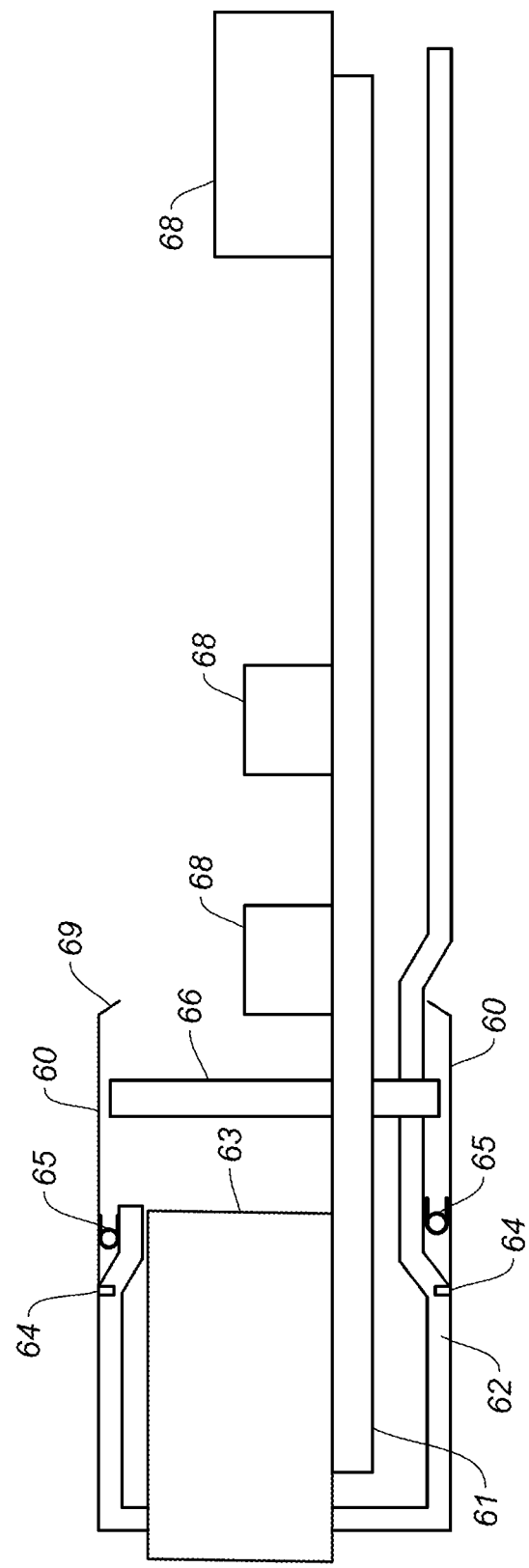
FIG. 6 is a schematic top view of a module with airflow panels in a closed position, in accordance with one embodiment.

FIG. 6 illustrates one embodiment in which panels 60 are located on opposite sides of the module 61. A panel assembly comprises a fixed portion 62 and the movable panel 60 connected through a hinge joint 64 to the fixed portion. The panel assembly may be attached to a face plate 63 of the module and utilize the hinge 64 and one or more torsion springs 65 to manage movement of the panel 60 between the open and closed positions. One or more protective stand-offs 66 may be incorporated into the module 61 to avoid the panel 60 hitting electronic components 68. As shown in FIG. 6, an edge portion 69 of the panel 60 may be angled to avoid scratching adjacent modules during insertion and removal. Also, the angled edge 69 may be used to prevent interference with adjacent modules in case the panel 60 is stuck inwards and the module needs to be removed. A plastic coating (e.g., frictionless material) may be applied to the panel 60 to avoid scratches during sliding movement between modules. The panel 60 may be constructed from sheet metal, a polycarbonate material, or any other suitable material.

Figure 7:
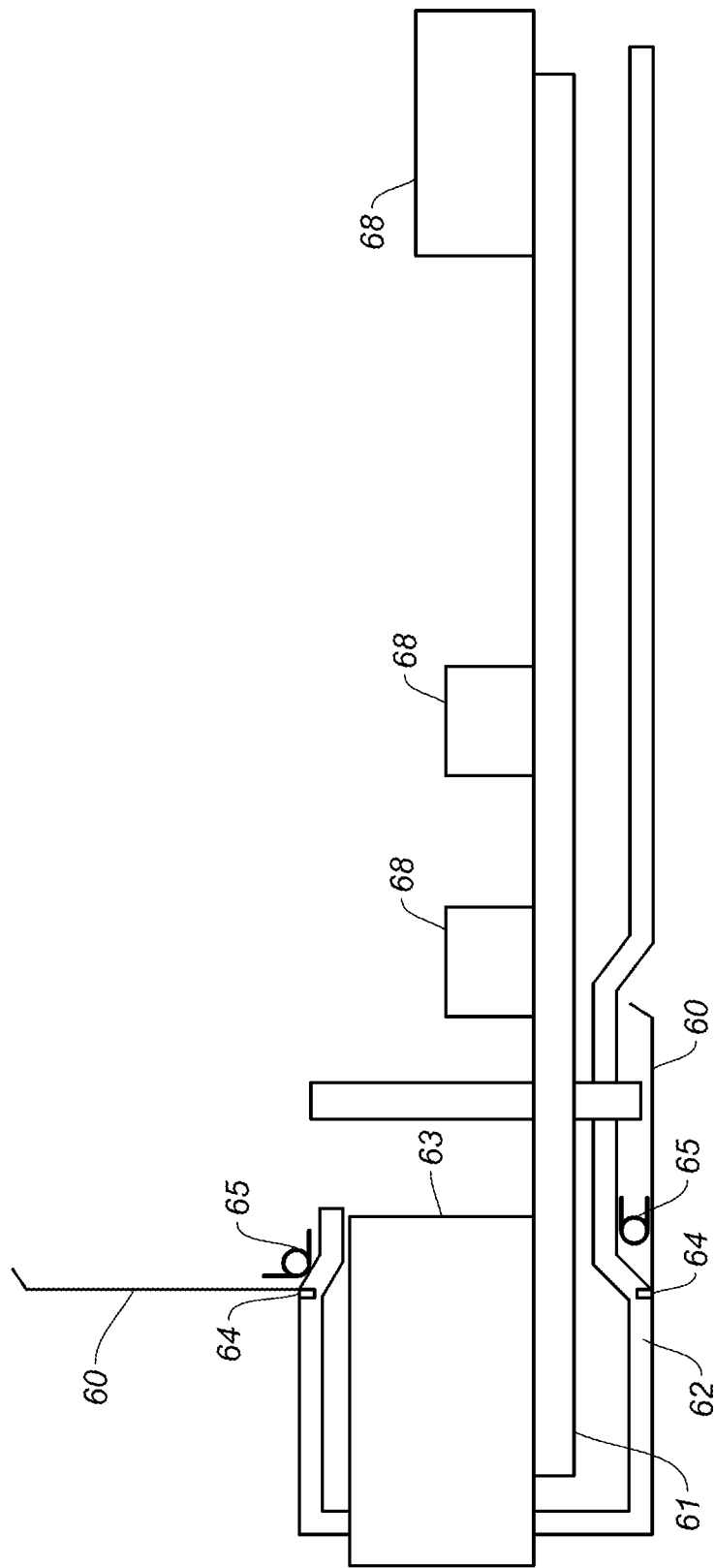
FIG. 7 is a schematic top view of the module of FIG. 6 with one of the airflow panels in an open position.

FIG. 7 shows the module of FIG. 6 with one of the panels 60 in an open position, in which the panel 60 extends generally 90 degrees from a longitudinal axis of the module 61 to prevent airflow bypass in an adjacent open slot when the adjacent module is removed (FIG. 2). As previously noted, the panels 60 may operate independently. For example, panels 60 may be in their closed positions (as shown in FIG. 6), both panels may be in their open positions, or one panel may be open while the other is closed (as shown in FIG. 7).

Figure 8:
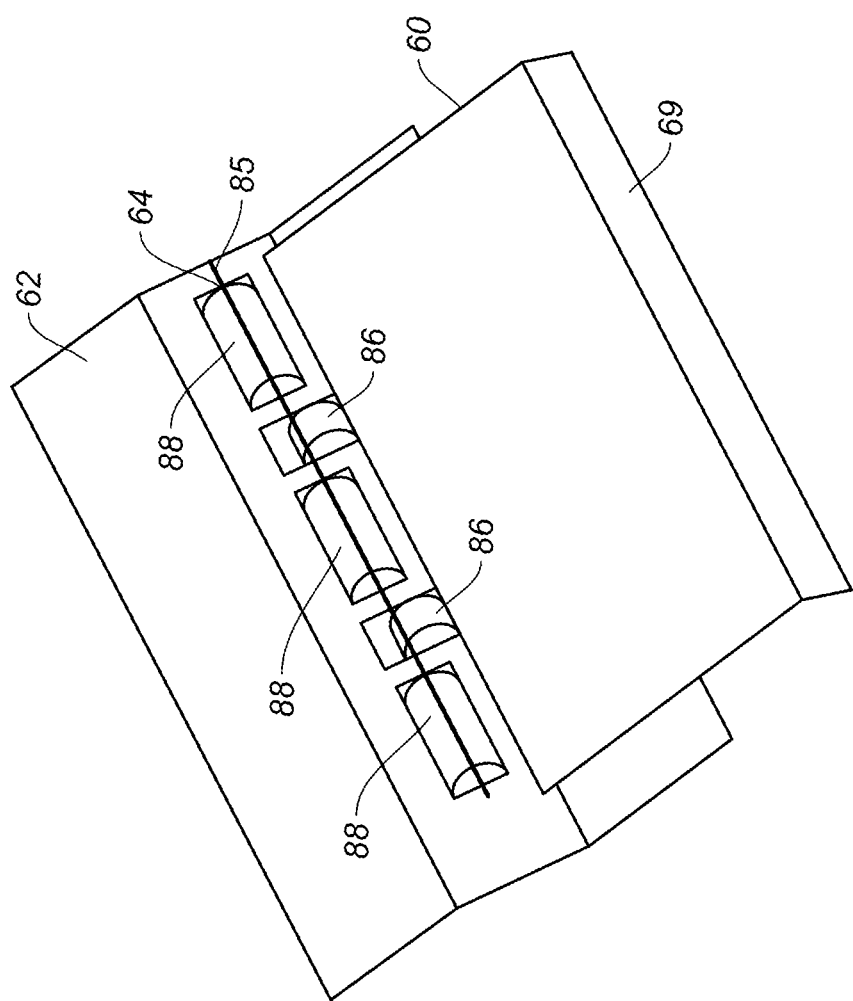
FIG. 8 is a perspective of the airflow panel of FIG. 6, in accordance with one embodiment.

FIG. 8 is a perspective of one example of the panel assembly shown in FIGS. 6 and 7. The fixed portion 62 is attached to the module (e.g., face plate of module as described above) and may be formed from sheet metal or other suitable material. The panel 60 is connected to the fixed portion 62 through the hinge joint 64 comprising a pin 85 extending through interlocking fingers 86 connected to the panel and 88 connected to the fixed portion 62. A mechanical arrangement with a small number (e.g., two) of hinge joints allows for controlled and smooth movement of the panel 60. As previously noted, the panel 60 may be formed from polycarbonate, sheet metal, or any other suitable material.

Figure 9:
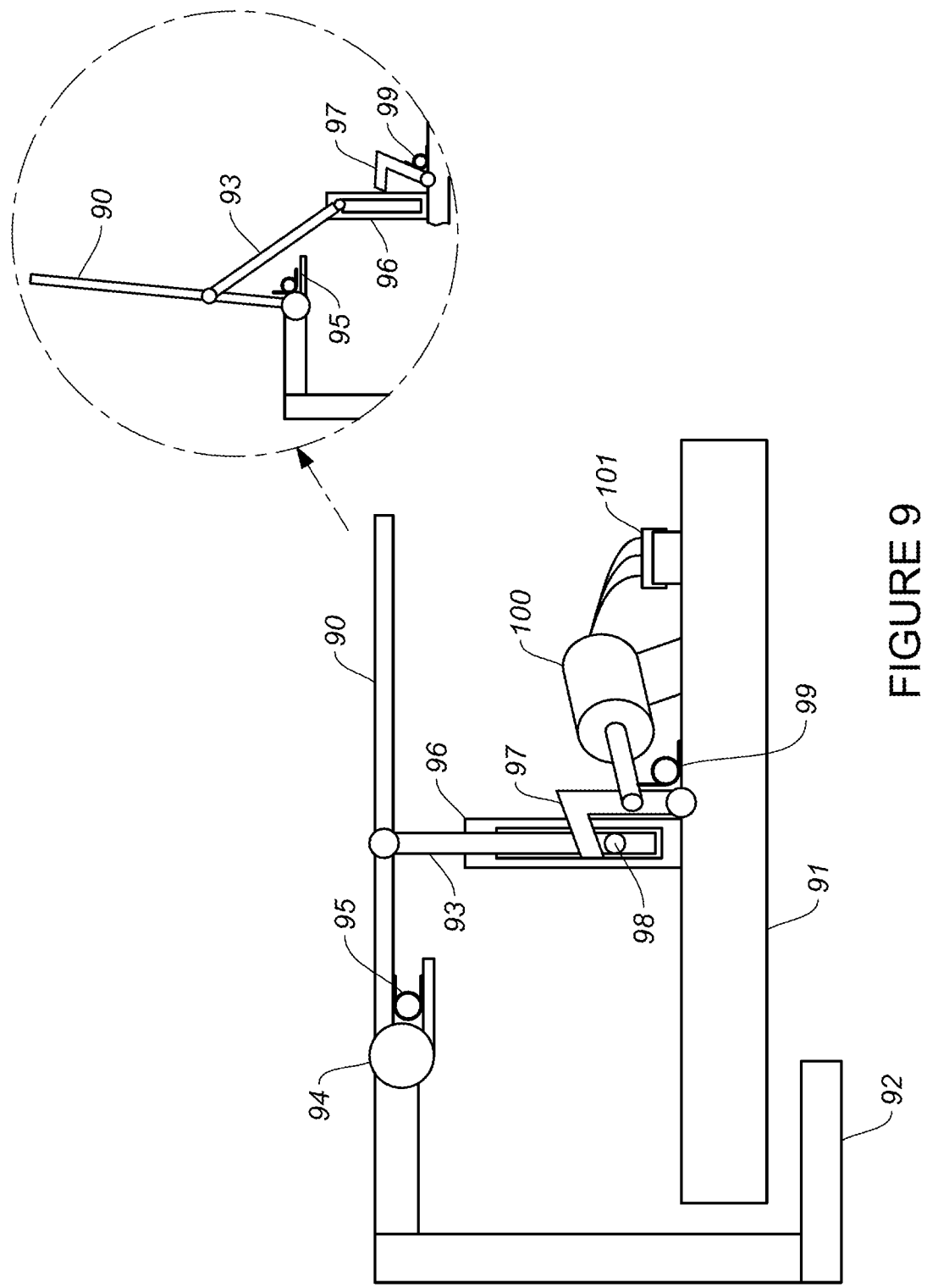
FIG. 9 is a schematic top view of a servo motor operated airflow panel, in accordance with one embodiment.

FIG. 9 illustrates an example of a locking mechanism that may be used to retain panel 90 in its closed position. In one or more embodiments, an electromechanical mechanism may be used to unlock the panel. As previously described the rotatable panel 90 is attached to a fixed portion 92 through hinge 94. A locking pin 98 on hinge lever 93 is locked in place by a spring lever 97, which is held in its locked position by torsion spring 99. The hinge lever 93 is attached to the panel 90 and slides within a slotted bracket 96. In one embodiment, the design of the spring lever 97 is such that the pin 98 may be locked in place through a small force pressing against it (press-fit), and the pin is released when the spring lever 97 is opened, as shown in the cut-out view of the panel 90 in its open position. The panel 90 is spring loaded by torsion spring 95 in its open position and the panel is free to pivot about hinge joint 94 to its open position once the locking pin 98 is released from the spring lever 97. As described below, movement of the panel 90 towards its closed position upon insertion of the OIR module forces the pin 98 back into its locked position.

In one embodiment, a servo motor 100 engages with the spring lever 97 to release the locking pin 98 from the spring lever. In one example, the miniaturized servo controlled motor 100 may be connected to the spring lever 97 to provide rotation needed for the spring lever (held in place by spring 99) to release locking pin 98. The servo motor 100 provides angular rotation to move the spring lever 97 thereby allowing the locking pin 98 and connected hinge lever 93 to move along the slotted bracket 96 and open the panel 90 to cover the open slot left by the removed module in the adjacent slot.

As shown in the cut-out view, the locking pin and hinge lever 93 are released and move along with the panel 90 when the panel is free to move to its open position when the adjacent module is removed. As previously described, the panel 90 is spring loaded by torsion spring 95 to move to its open position. In one embodiment, the opening of the panel 90 may be automated with the action of the servo motor 100 such that the panel is resting against an adjacent module when unlocked, opening fully when the module 16 is removed. The spring lever 97 may return to its spring biased position after the locking pin 98 is released.

The servo motor 100 may be activated as soon as the OIR button 19a on the module to be replaced is pressed (FIGS. 2 and 9) or when the cooling state has been reached. As described above, activation of the OIR button 19a on the OIR module may initiate powering down of the module so that it can be extracted from the system. This may also trigger software controls (panel logic 18b), and a signal may be transmitted to the servo motor 100 of the adjacent module to activate its panel 90. The panel logic 18b may receive input from the OIR button 19a, cooling logic 18b, thermal sensor 18c, software logic that monitors module presence, or any combination thereof to initiate unlocking of the panel 90. For example, the panel 90 may be unlocked when the OIR button 19a is pushed, when the thermal sensor 18c (or cooling logic 18a) indicates that the cooling state has been reached, or based on input from both the OIR button and thermal sensor. The panel logic 18b may send a signal to the servo motor 100 via a PCB (Printed Circuit Board) connection 101 attached to the PCB of the module 91.

The panel 90 is pushed back into its locked position when the adjacent module 16 is inserted back into the open slot 22 (FIGS. 2 and 9). The location and length of the hinge lever 93, slotted bracket 96, and spring lever 97 are preferably optimized so that movement of the panel 90 by adjacent module 16 locks the pin 98 with the panel returning to its closed (locked) position.

Figure 10:
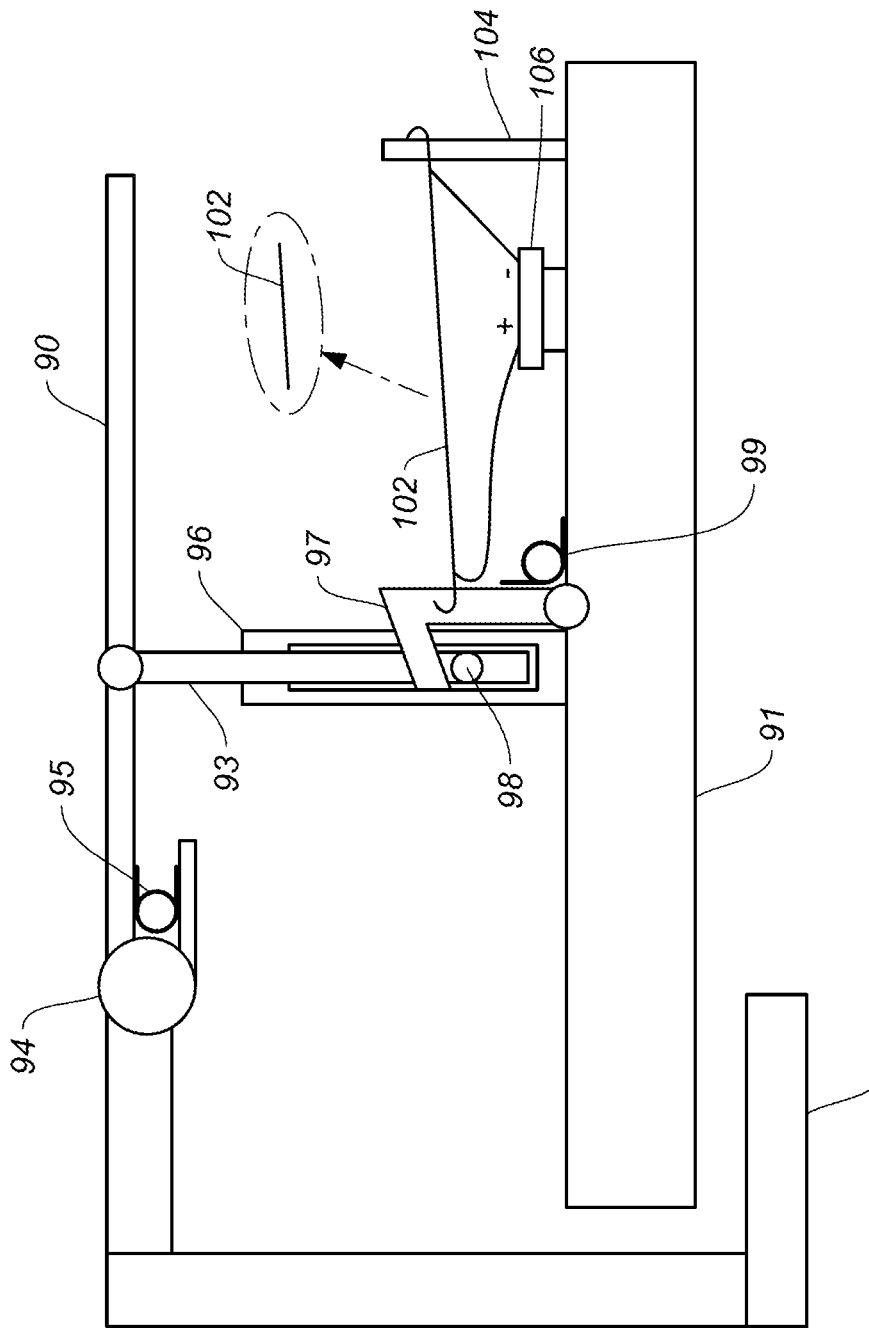
FIG. 10 is a schematic top view of a shape memory alloy filament operated airflow panel, in accordance with one embodiment.

FIG. 10 illustrates another example of an automated mechanism for opening the panel 90 in which a shape memory alloy filament 102 is used to move the spring lever 97 and release the locking pin 98 from its locked position. Filament 102 is connected substantially rigidly at one end to bracket 104 and at the other end to the spring lever 97. Filament 102 operates between an elongated and a shortened state. Heating filament 102 to a specific phase transition temperature will initiate the elongated to shortened phase state change. The original (shortened) shape of the shape memory alloy filament 102 is shown in a cut-out view. The filament 102 returns to its shortened state shape when it is heated by a current pulse (typically 2-3 seconds in duration) that is passed through the wire 102 via PCB connection 106. As the filament 102 is shortened, it pulls lever 97, which releases pin 98 and hinge lever 93. After the current pulse ceases, filament 102 cools and spring lever 97 through torsion spring 99 stretches filament 102 back to its elongated phase state. Filament 102 may be formed from any suitable shape memory alloy (e.g., Nitinol (nickel titanium) or any other shape memory alloy (smart metal, memory metal alloy, smart alloy)).

Figure 12:
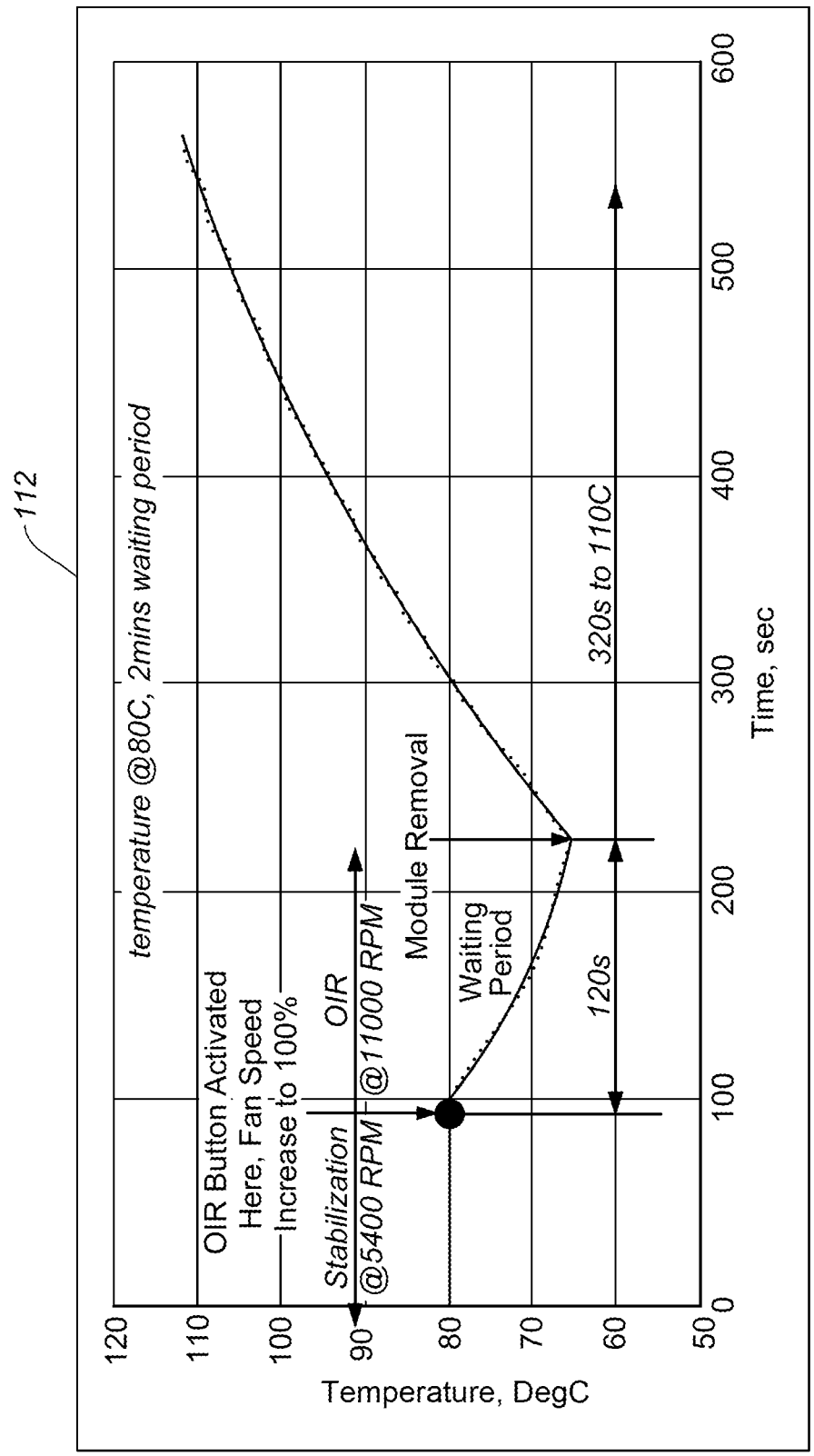
FIG. 12 is a graph illustrating an example of impacted module temperature when a module is removed after a waiting period.

Additionally, filament 102 may also provide a thermomechanical "backup" protection feature where by setting a suitable metallurgical phase transition temperature filament 102 may be caused to pull lever 97 if local system operating temperature reaches a predetermined temperature point, typically within the waiting period shown in FIG. 12. As described above with the respect to the servo motor 100 of FIG. 9, the spring 102 may be activated (current applied) when the OIR button 19a is pushed or when the cooling state has been reached.

It is to be understood that the mechanisms for unlocking the panel 90 shown in FIGS. 9 and 10 are only examples and that other manual or automated mechanisms may be used to unlock the panel without departing from the scope of the embodiments.

The following describes results of experiments showing the thermal impact on the impacted module when the OIR module is removed. Without a waiting period or airflow panel 20 deployed, the temperature on the impacted module (FC6-S2 card in the example of FIG. 2) starts to increase as soon as the OIR module (FC2-S2 card) is removed from the system as air starts to bypass from the slot opening to ambient. Since each module has a limit on the maximum operating temperature, this continuous increase in temperature would limit the time for module replacement.

Figure 11:
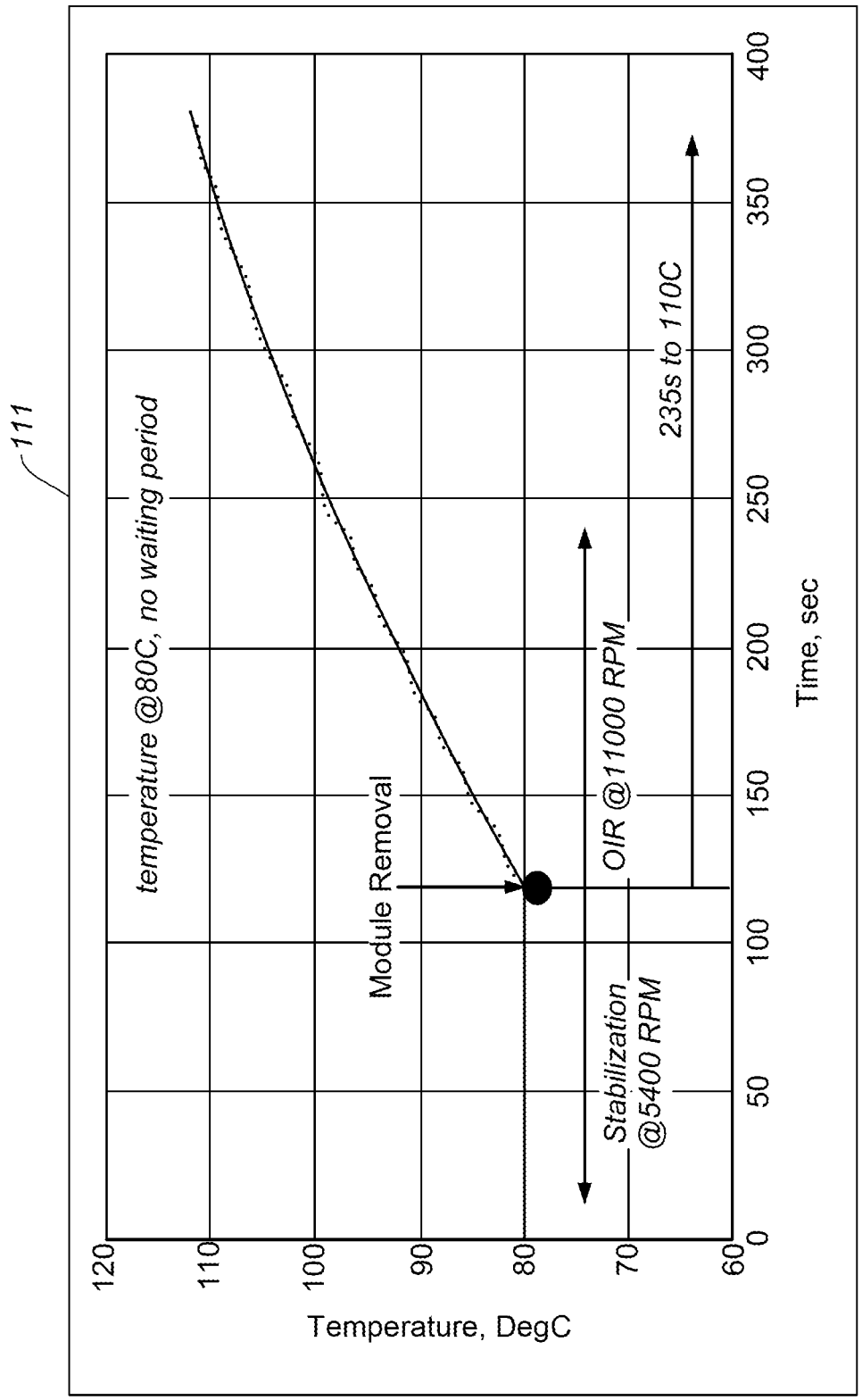
FIG. 11 is a graph illustrating an example of impacted module temperature when a module is removed without a waiting period.

FIG. 11 shows a graph 111 illustrating an example of temperature rise at the impacted module upon removal of a module without a cooling (waiting) period. Temperature is graphed over time and shows the rise in temperature when the module is removed. The temperature at the impacted module before removal of the OIR module is 80° C. In this example, the maximum allowed device temperature is 110° C. and the available OIR time without a waiting period is 235 seconds.

FIG. 12 shows a graph 112 illustrating the temperature rise after a cooling (waiting) period in which the fan speed is increased before the module is removed. As described above, the waiting period is the time needed to stabilize a device operating temperature to its lowest value by increasing the fan speed (e.g., to 100%). In the example shown in FIG. 12, the OIR button is activated at Time=100 seconds. The fan speed is increased from 5400 rpm to 11000 rpm. After 120 seconds the temperature stabilizes at its lowest point. The module is then removed (at Time=220 seconds). In this example, the available OIR time with the waiting period is 320 seconds.

Figure 13:
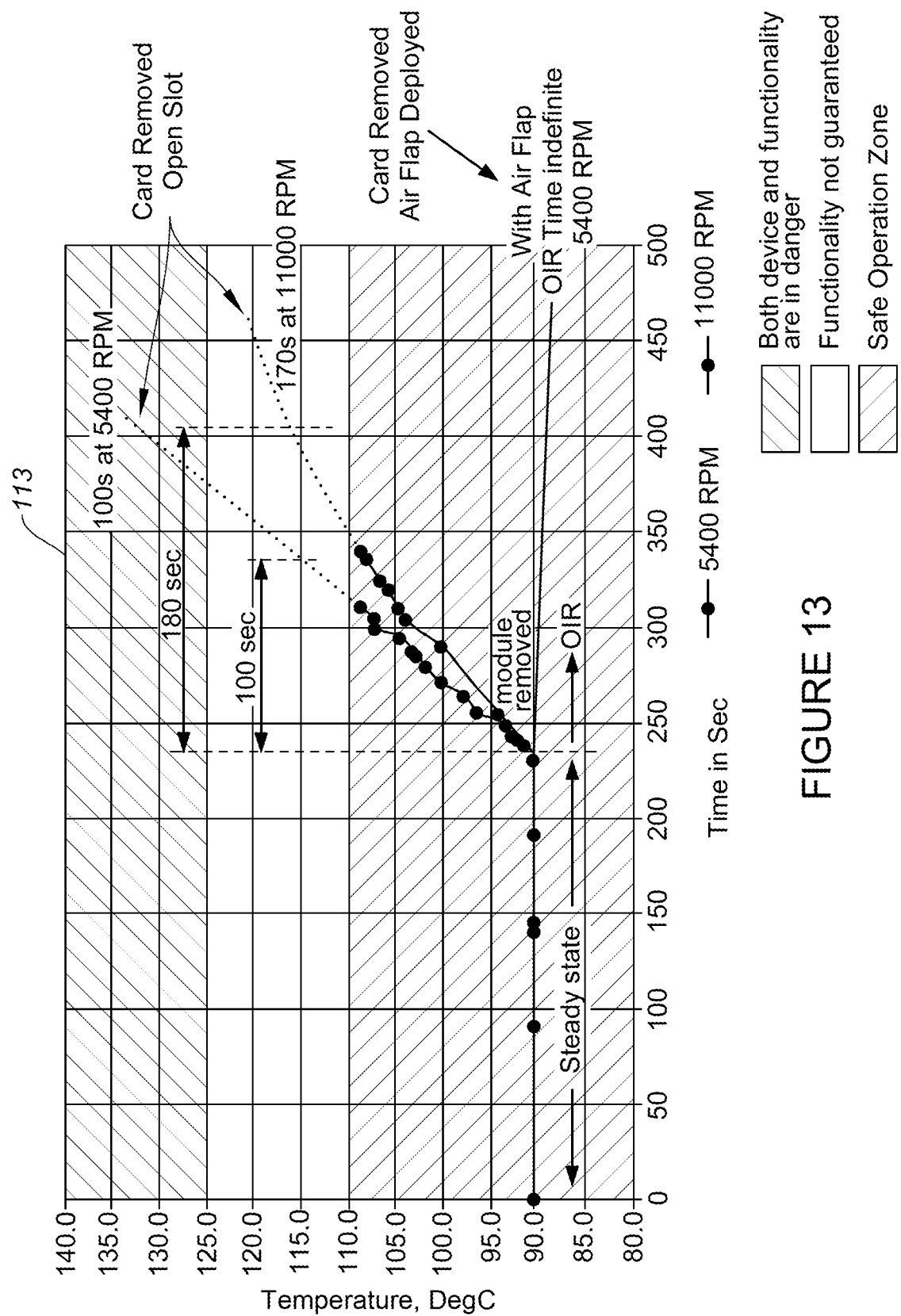
FIG. 13 is a graph illustrating an example of impacted module temperature with an airflow panel deployed.

FIG. 13 shows a graph 113 illustrating an example of temperature changes over time with the airflow panel 20 deployed into open slot 22 (FIGS. 2 and 13). The impacted device temperature is at steady state until the module is removed at Time=230 seconds. The change in temperature over time is shown with no panel and the fan speed at 5400 rpm, with no panel and the fan speed at 11000 rpm, and with the panel deployed and fan speed at 5400 rpm. Without the panel, the temperature on the impacted module starts to increase as soon as the OIR module is removed from the system as the air starts to bypass from the slot opening to ambient. With the panel 20 deployed, the temperature at the impacted module improves due to the fact that the top row slot air resistance improved from the absence of the module and the closed slot opening prevented airflow bypass. The OIR time limit improved indefinitely with the airflow panel 20 deployed.

As can be observed from the foregoing, the embodiments described herein may provide numerous advantages. For example, one or more embodiments allow more time for module replacement and allow for replacement times beyond conventional OIR times. In one or more embodiments, the airflow panel avoids air bypass through the slot opening of the removed module, thereby improving thermal management of the system. In one or more embodiments, cooling logic helps to maintain cooling within the modular electronic system by pre-cooling adjacent modules before removal of the OIR module.

Although the method and apparatus have been described in accordance with the embodiments shown, one of ordinary skill in the art will readily recognize that there could be variations made to the embodiments without departing from the scope of the invention. Accordingly, it is intended that all matter contained in the above description and shown in the accompanying drawings shall be interpreted as illustrative and not in a limiting sense.

What is claimed is:

1. A computer-implemented method comprising:
   receiving a first indication at a modular electronic system of initiation of online removal for a module that is removably inserted into a slot of the modular electronic system;
   locking the module in place after the first indication;
   increasing a fan speed at the modular electronic system before the module is removed;
   monitoring an internal temperature at the modular electronic system; and
   providing a second indication that the module is ready for removal upon reaching a specified cooling state at the modular electronic system based on monitoring the internal temperature,
   wherein a panel on an adjacent module is opened and extends into the slot upon removal of the module to substantially block airflow bypass from the slot and maintain cooling within the modular electronic system.

2. The computer-implemented method of claim 1, wherein receiving the first indication includes identifying a depressed Online Insertion and Removal (OIR) button at the module.

3. The computer-implemented method of claim 1, further comprising:
   unlocking the module for removal upon reaching the specified cooling state.

4. The computer-implemented method of claim 1, wherein monitoring the internal temperature comprises monitoring a thermal sensor located in an area of one of a plurality of modules installed in the modular electronic system.

5. The computer-implemented method of claim 1, further comprising:
   turning on an indicator light at the module upon receiving the first indication.

6. The computer-implemented method of claim 5, wherein providing the second indication comprises changing the indicator light when the modular electronic system reaches the specified cooling state.

7. The computer-implemented method of claim 1, further comprising:
   unlocking the panel when the specified cooling state is reached.

8. The computer-implemented method of claim 1, further comprising:
   transmitting an electrical signal to a locking mechanism to unlock the panel on the adjacent module before the module is removed.

9. The computer-implemented method of claim 8, wherein the locking mechanism comprises a servo controlled motor.

10. The computer-implemented method of claim 8, wherein the locking mechanism comprises a shape memory filament.

11. A modular electronic system comprising:
    a memory configured to store executable instructions; and
    a processor coupled to the memory, and configured to perform operations comprising:
       receiving a first indication of an initiation of an online removal for a module that is removably inserted into a slot of the modular electronic system;
       controlling locking of the module in place after the first indication is received;
       controlling to increase a fan speed before the module is removed;
       monitoring an internal temperature; and
       providing a second indication that the module is ready for removal upon reaching a specified cooling state based on monitoring the internal temperature,
    wherein a panel on an adjacent module is opened and extends into the slot upon removal of the module to substantially block airflow bypass from the slot and maintain cooling within the modular electronic system.

12. The modular electronic system of claim 11, wherein the processor is configured to receive the first indication by identifying a depressed Online Insertion and Removal (OAR) button at the module.

13. The modular electronic system of claim 11, wherein the processor is further operable to unlock the module for removal when the internal temperature has reached the specified cooling state.

14. The modular electronic system of claim 11, wherein the processor is configured to monitor the internal temperature by monitoring a thermal sensor located in an area of one of a plurality of modules installed in the modular electronic system.

15. The modular electronic system of claim 11, wherein the processor is further operable to turn on an indicator light at the module upon receiving the first indication.

16. Logic encoded on one or more non-transitory computer readable media for execution and when executed by a processor operable to:
- identify an initiation of an online removal process for a module that is removably inserted into a slot of a modular electronic system;
- control locking of the module in place after identifying the initiation of the online removal process;
- control increase a fan speed at the modular electronic system before the module is removed;
- monitor an internal temperature at the modular electronic system;
- provide an indication that the module is ready for removal upon reaching a specified cooling state at the modular electronic system based on the internal temperature being monitored; and
- unlock a panel on an adjacent module so that the panel is free to open and extend into the slot upon removal of the module to substantially block airflow bypass from the slot and maintain cooling within the modular electronic system.

17. The logic of claim 16, further operable to:
- unlock the module for removal from the modular electronic system when the specified cooling state is reached.

18. The logic of claim 16, wherein the indication includes a visible indication.

19. The logic of claim 16, wherein the logic is operable to:
- transmit a signal to an electromechanical mechanism for unlocking the panel prior to the removal of the module.

20. The computer-implemented method of claim 1, wherein the module is locked until the second indication is provided.

* * * * *

UNITED STATES PATENT AND TRADEMARK OFFICE
CERTIFICATE OF CORRECTION

| | | |
|---|---|---|
| PATENT NO. | : 12,137,530 B2 | Page 1 of 1 |
| APPLICATION NO. | : 17/470465 | |
| DATED | : November 5, 2024 | |
| INVENTOR(S) | : Rohit Dev Gupta et al. | |

It is certified that error appears in the above-identified patent and that said Letters Patent is hereby corrected as shown below:

On the Title Page

Item (72), Inventors Line 3:
Replace "Sarma V M K Vedhanabhatla" with --Sarma VMK Vedhanabhatla--

Signed and Sealed this
Twenty-fourth Day of December, 2024

Derrick Brent
*Acting Director of the United States Patent and Trademark Office*